United States Patent [19]

Dreifus et al.

[11] Patent Number: 5,506,422
[45] Date of Patent: Apr. 9, 1996

[54] MOIS JUNCTION FOR USE IN A DIAMOND ELECTRONIC DEVICE

[75] Inventors: David L. Dreifus; Michelle L. Hartsell, both of Cary, N.C.

[73] Assignee: Kobe Steel USA, Inc., Research Triangle Park, N.C.

[21] Appl. No.: 348,485

[22] Filed: Dec. 2, 1994

Related U.S. Application Data

[63] Continuation-in-part of Ser. No. 62,052, May 14, 1993, Pat. No. 5,371,383.

[51] Int. Cl.$^6$ .............................................. H01L 31/0312
[52] U.S. Cl. ............................ 257/77; 257/328; 257/383; 257/764
[58] Field of Search .............................. 257/77, 328, 383, 257/764

[56] References Cited

U.S. PATENT DOCUMENTS

| | | | |
|---|---|---|---|
| 4,903,089 | 2/1990 | Hollis et al. | 357/22 |
| 5,107,315 | 4/1992 | Kumagai et al. | 357/23.15 |
| 5,173,761 | 12/1992 | Dreifus et al. | 257/22 |
| 5,254,862 | 10/1993 | Kalyankjuma et al. | 257/77 |
| 5,371,383 | 12/1994 | Miyata et al. | 257/77 |

OTHER PUBLICATIONS

Chan et al., Pattern transfer onto carbon films on silicon using radio frequency oxygen plasma etching, *J. Vac. Sci. Technol. A.*, vol. 10, No. 1, pp. 225–228 (Jan./Feb. 1992).
Skavantzos, Complementary Vertical Bipolar Transistor Process Using High–Energy Ion Implantation, *Electronic Letters*, vol. 27, No. 23, pp. 2141–2143 (Nov. 1991).
Ishikawa et al., A High–Power High–Gain VD–MOSFET Operating at 900 MHz, *IEEE Transactions of Electron Devices*, vol. Ed–34, No. 5, pp. 1157–1162 (May 1987).
Ozawa et al., A Vertical FET with Self–Aligned Ion–Implanted Source and Gate Regions, *IEEE Transactions on Electron Devices*, vol. ED–25, No. 1, pp. 56–57 (Jan. 1978).
Hewett et al., *Fabrication of an Insulated Gate Diamond FET for High Temperature Applications*, Int'l High Temp Electronics Conference, pp. 168–173 (1991).
Tsai et al., Diamond MESFET Using Ultrashallow RTP Boron Doping, *IEEE Electronic Device Letters*, vol. 12, No. 4, pp. 157–159 (Apr. 1991).
Rothschild et al., Excimer–laser etching of diamond and hard carbon films by direct writing and optical projection, *J. Vac. Sci. Technol. B.*, vol. 4, No. 1, pp. 310–314 (Jan./Feb. 1986).
Nishimura et al., Material and electrical characterization of polycrystalline boron–doped diamond films grown by microwave plasma chemical vapor deposition, *J. Appl. Phys.*, vol. 69, No. 5, pp. 3142–3148 (Mar. 1, 1991).
Fountain et al., IGFET Fabrication on Homoepitaxial Diamond in Situ Boron and Lithium Doping, *Electrochemical Society Meeting*, Washington, D.C. (May 1991).
Gildenblat et al., High–Temperature Thin–Film Diamond Field–Effect Transistor Fabricated Using a Selective Growth Method, *IEEE Electron Device Letters*, vol. 12, No. 2, pp. 37–39 (Feb. 1991).
Tessmer et al., Polycrystalline diamond field–effect transistors, *Elsevier Science Publishers B.V.*, pp. 89–92 (1992).
Kobashi et al., *Microfabrication of Diamond Films: Selective Deposition and Etching* (Sep. 1990).
Grot et al., The Effect of Surface Treatment on the Electrical Properties of Metal Contacts to Boron–Doped Homoepitaxial Diamond Film, *IEEE Electron Device Letters*, vol. 11, No. 2, pp. 100–102 (Feb. 1990).

*Primary Examiner*—Edward Wojciechowicz
*Attorney, Agent, or Firm*—Bell, Seltzer, Park & Gibson

[57] ABSTRACT

A junction suitable for incorporation in diamond electronic devices, such as field effect transistors, U-V photodetectors, capacitors, charge-coupled devices, etc., comprising a double layer structure deposited on the semiconducting diamond film of the electronic device, wherein the double layer structure consists of a layer of intrinsic diamond and a layer of a carrier blocking material. The carrier blocking materials is characterized by a band structure discontinuous with that of diamond resulting in the formation of a depletion layer at the interface. A contact is then formed on this double layer structure.

23 Claims, 3 Drawing Sheets

REMOVE SELECTIVE AREA DEPOSITION MASK

MOIS JUNCTION FOR USE IN A DIAMOND ELECTRONIC DEVICE

CROSS-REFERENCE TO RELATED APPLICATIONS

This application is a Continuation-in-Part of application Ser. No. 62,052 filed on May 14, 1993, issued as U.S. Pat. No. 5,371,383 on Dec. 6, 1994, and assigned to the assignee of the present invention.

FIELD OF THE INVENTION

The present invention relates to a new type of junction which may be employed in diamond electronic devices such as field effect transistors, U-V photodetectors, capacitors, and charge coupled devices.

BACKGROUND OF THE INVENTION

There are many potential applications for devices fabricated from semiconducting diamond operating in a wide variety of extreme environmental conditions, at high frequencies, and in high power applications. Such wide use is possible primarily because of the many unique properties of diamond such as chemical inertness, high electron and hole mobilities, low dielectric constant, radiation hardness, mechanical strength, large electron energy band gap, and optical transparency.

One such device structure, the diamond field effect transistor (FET) has been proposed and fabricated on homoepitaxial layers deposited by chemical vapor deposition, single crystal substrates, and polycrystalline thin films also deposited by CVD.

The design and fabrication of horizontal diamond FETs have been widely reported in the art. See for example, U.S. Pat. No. 3,603,848 entitled *Complementary Field-Effect-Type Semiconductor Device* by Sato et al. and publications entitled *High-Temperature Thin-Film Diamond Field-Effect Transistor Fabricated Using a Selective Growth Method* by Gildenblat et al., IEEE Electron Device Letters, Vol. 12, No. 2, pp. 37–39 (Feb. 1991); *Fabrication of an Insulated Gate Diamond FET for High Temperature Applications* by Hewett et al., presented at the International High Temperature Electronics Conference in Albuquerque, N.M., pp. 168–173 (Jun. 1991); and *IGFET Fabrication of Homoepitaxial Diamond Using in Situ Boron and Lithium Doping* by Fountain et al., presented at the Electrochemical Society meeting held in Washington, D.C. (May 1991). See also the publication by Tessmer et al., *Polycrystalline diamond field-effect transistors*, Diamond and Related Materials I, Elsevier Science Publishers B. V., Amsterdam, Holland, pp. 89–92 (1992).

The active channels of the devices are formed from semiconducting diamond using either naturally occurring type IIb single crystals, in-situ boron doped homoepitaxial layers or polycrystalline diamond deposited in silicon substrates, ion implantation into single crystal diamond, or through use of an elevated temperature diffusion process. Some of these devices employ a selected area deposition of homoepitaxial diamond films, with in-situ boron doping, grown on insulating crystals.

In some cases, a metal-semiconductor (MS) junction formed by depositing a metal contact directly on the semiconducting diamond film was employed to form a so-called "depletion-mode diamond metal-semiconductor field effect transistor" (MESFET) such as described in Tsai et al. *Diamond MESFET Using Ultrashallow RTP Boron Doping Electron Device Letters*, Vol. 12, No. 4, pp. 157–159 (1991). By choosing a suitable metal, it was possible to provide a junction displaying rectifying characteristics provided semiconducting diamond films of low dopant concentrations were used. If a diamond film of high dopant concentration was employed, it became difficult to maintain a low leakage rectifying contact. Furthermore, even for films of low dopant concentrations, it was impossible to use the MESFET in enhancement mode because current tended to flow through the MS junction when even small forward biases were applied to the gate contact, and significantly decreased breakdown voltages provided for poor operation at elevated temperatures even when operated in depletion mode.

Some devices employed a junction incorporating a film of silicon dioxide between the metal and the semiconducting diamond to form a depletion-mode metal oxide semiconductor FET (MOSFET), such as described, for example, in Grot et al., *The Effect of Surface Treatment on the Electrical Properties of Metal Contacts to Boron-Doped Homoepitaxial Diamond Film*, IEEE Elect. Device Letters, Vol. 11, No. 2, pp. 100–102 (Feb. 1990), and Tessmer et al., *Polycrystalline diamond field-effect transistors*, Diamond and Related Materials I, pp. 89–92 (1992). Other devices employed a junction including an intrinsic diamond film to form a metal-intrinsic diamond-semiconductor FET (MiSFET) such as described in U.S. Pat. No. 5,173,761 entitled *Semiconducting Polycrystalline Diamond Electronic Devices Employing An Insulating Diamond Layer*. In the case of the MiSFET, inevitable defects in nominally undoped diamond films and contamination of the nominally undoped diamond films through the action of auto-doping effects of the underlying doped diamond layer meant that operation in enhancement mode was extremely limited even at low temperatures and depletion mode performance was deteriorated at elevated temperatures.

High temperature operation is also limited for a MOSFET device. The possibility of surface reactions and a high field region at the diamond/silicon dioxide interface can cause decreased breakdown voltages and large leakage currents at elevated temperatures. If operated in enhancement mode, the $SiO_2$/diamond interface becomes critical to the device performance as the majority of current transport occurs at the interface and consequently the action of the above effects means that enhancement mode operation particularly at elevated temperatures is severely limited.

The diamond film FET devices of the prior art currently exhibit poor leakage characteristics, especially at elevated temperatures where diamond electronic devices are expected to have a significant advantage over other materials. There is at present a demand for a junction suitable for use in devices such as FETs through which the excellent characteristics of diamond at high temperatures may be more fully exploited.

SUMMARY OF THE INVENTION

It is an object of the present invention to provide a new type of junction suitable for incorporation in diamond electronic devices, such as a field effect transistors (FET), U-V photodetectors, capacitors, or charge coupled devices, in order to improve the performance of the electronic device, particularly at high temperatures.

It is a further object of the present invention to provide a junction which exhibits reduced leakage currents at elevated temperatures and for which breakdown voltages (bias) for operation at elevated temperatures are increased in magnitude thereby extending the range of applications of a device incorporating the junction.

It is also an object of this invention to provide a vertical diamond field effect transistor and horizontal field effect transistors incorporating the junction of the present invention.

The above objects are achieved through the following structure. The junction of the present invention comprises a double layer formed on a semiconducting diamond film, and a contact formed on said double layer structure. The double layer structure consists of an intrinsic diamond film and a film of a material having the characteristics of being capable of blocking the transport of charge carriers into the contact. The carrier blocking materials is characterized by a band structure discontinuous with that of diamond resulting in the formation of a depletion layer at the interface.

In order that an epitaxial relationship is maintained between the semiconducting diamond and the intrinsic diamond it is preferred that the intrinsic diamond film is formed on the semiconducting diamond film with the film of a current blocking material formed on the intrinsic diamond film. This new junction is considered to be well suited for fabrication from both polycrystalline and single crystal diamond films.

The structure described above shows improved leakage characteristics at elevated temperatures which are manifested in a voltage-current characteristic exhibiting breakdown voltages of increased magnitude. Thus an electronic device such as a field effect transistor incorporating the junction according to this invention is expected to have an improved performance, particularly at high temperatures, when compared with the MESFET, MiSFET, and MOSFET devices of the prior art.

The junction of this invention is less susceptible to the high activation energy that can sometimes be found in unintentionally doped (intrinsic) diamond near 1.0 eV, as well as other defects within the diamond. It is also less susceptible to potential surface reactions that may occur between the silicon dioxide (or other carrier blocking material) and diamond materials which have limited the high temperature operation of previous devices since the maximum electric field in the double layer structure is reduced.

The performance of a diamond field effect transistor incorporating the junction of the present invention can be further improved by providing regions of highly doped diamond between the semiconducting diamond film and the source and drain metal contacts.

The foregoing and other objects and aspects of the present invention are explained in detail in the specification set forth below.

BRIEF DESCRIPTION OF THE DRAWINGS

Some of the features and advantages of the invention having been stated, others will become apparent from the detailed description which follows, and from the accompanying drawings, in which.

DETAILED DESCRIPTION OF THE INVENTION

The present invention now will be described more fully hereinafter with reference to the accompanying drawings, in which preferred embodiments of the invention are shown. This invention can, however, be embodied in many different forms and should not be construed as limited to the embodiments set forth herein; rather, Applicant provides these embodiments so that this disclosure will be thorough and complete, and will fully convey the scope of the invention to those skilled in the art.

Figure 1:
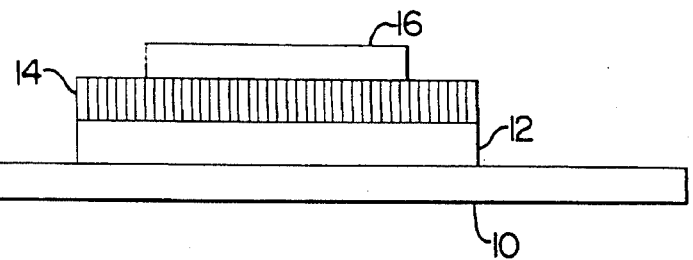
FIG. 1 shows a cross-sectional view of the basic structure of the junction according to this invention.

A preferred embodiment of the junction according to the present invention is shown in FIG. 1. An intrinsic diamond film 12 is deposited on a semiconducting diamond film 10 such as a boron-doped diamond film. A film of a carrier blocking material 14 is then deposited on the intrinsic diamond film 12. By depositing the intrinsic diamond film 12 on the semiconducting diamond film 10 and then depositing the film of a carrier blocking material 14 on the intrinsic diamond film 12, the epitaxial relationship between the semiconducting diamond 10 and the intrinsic diamond 12 is maintained. A contact 16 is then formed on the film of the carrier blocking material.

Any material that blocks the transport of charge carriers into the contact can be used as the carrier blocking material. This characteristic is typically obtained through the formation of a depletion layer at the interface and results from a discontinuity in the band structures of the diamond and the material selected as the carrier blocking material. In the case that the semiconducting diamond film 10 is a p-type diamond film, such as boron-doped diamond film, a material that blocks the flow of "holes" is selected. Examples of materials with this property are insulators such as silicon dioxide ($SiO_2$) and aluminum oxide ($Al_2O_3$), or materials such as intrinsic cubic boron nitride (BN) and intrinsic aluminum nitride (AlN). In the case of p-type diamond, n-type cubic boron nitride can be also used. Silicon dioxide is the preferred material for the carrier blocking material and can be employed with semiconducting diamond films of both p and n types.

The materials contact 16 formed on the film of the carrier-blocking material 14 can be made from any high temperature compatible material such as gold, aluminum,, silver, nickel, palladium, platinum, tungsten, magnesium, titanium, chromium, and alloys thereof. Gold and alloys therewith are preferred carrier-blocking materials.

It is preferred that the thickness of the intrinsic diamond film 12 and the film of the carrier blocking material 14 be in the range of 0.01 to 5 microns and it is further preferred that they be in the range of 0.1 to 0.5 microns.

Figure 2:
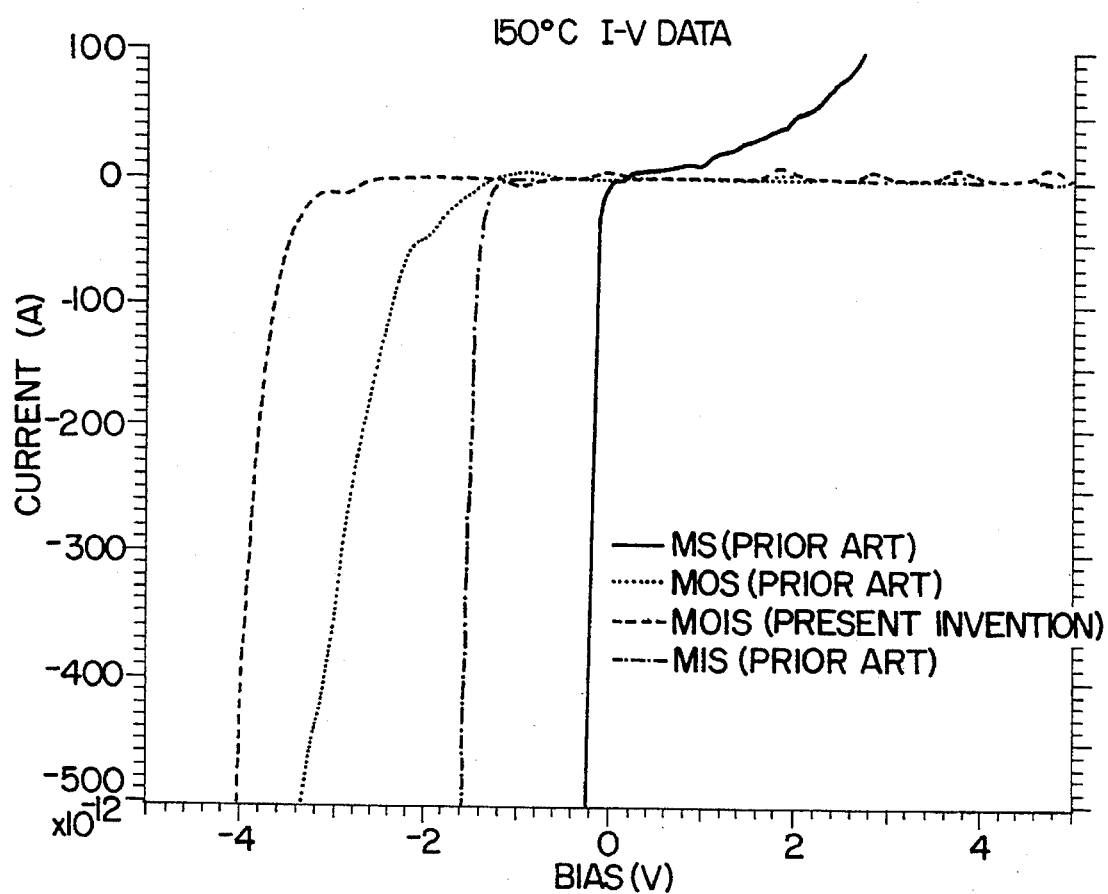
FIG. 2 shows the current-voltage characteristic at 150° C. for a preferred embodiment of the junction of the present invention together with, for comparison, the current-voltage characteristics at the same temperature for MS, MiS, and MOS type junctions of the prior art.

The current-voltage characteristic of the preferred embodiment of the junction of the present invention, incorporating a film of silicon dioxide as the film of carrier blocking material and which shall hereafter be referred to as an MOiS junction, is shown in FIG. 2 together with the current-voltage characteristics for the MS, MOS, and MiS type junctions of the prior art. As can be seen from FIG. 2, which shows the current-voltage characteristics for operation at 150° C., the MOiS junction of the present invention exhibits breakdown of the highest magnitude of all the structures tested.

Table 1 below shows the capacitance voltage measurements for the MOiS junction of the present invention. The data shows that the inclusion of the silicon dioxide layer has no adverse effect on the capacitance characteristics of the junction and clearly demonstrates that the depletion regions are controlled and suitable tier use in a field effect transistor.

TABLE 1

| SAMPLE | Na—Nd(cm−3) | Std. Deviation (cm−3) |
|---|---|---|
| SC12 MS (PRIOR ART) | 1.99E + 16 | 3.05E + 14 |
| SC12 MOiS | 2.04E + 16 | 2.11E + 15 |
| SCB MS (PRIOR ART) | 1.75E + 16 | 2.53E + 15 |
| SCB MIS (PRIOR ART) | 1.68E + 16 | 2.03E + 15 |

Figure 3:
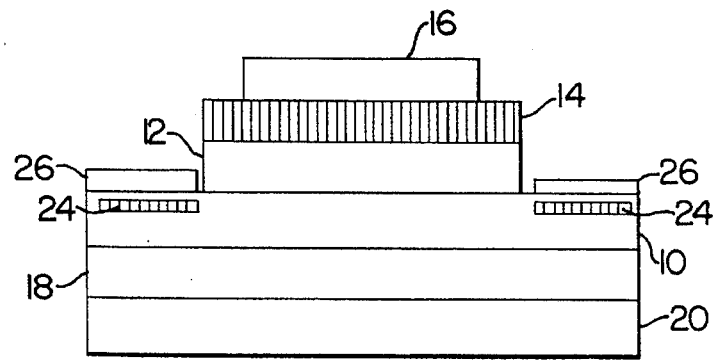
FIG. 3 shows a cross-sectional view of a horizontal field effect transistor incorporating a preferred embodiment of the junction of the present invention.
Figure 4A:
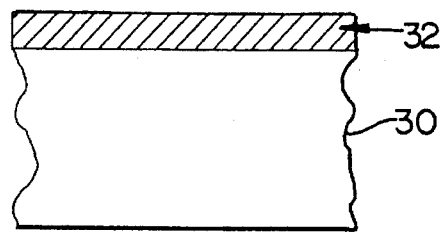
FIG. 4(a) through 4(h) show cross-sectional views of the intermediate structures in the process of making a vertical diamond field effect transistor incorporating a preferred embodiment of the junction of the present invention.
Figure 4B:
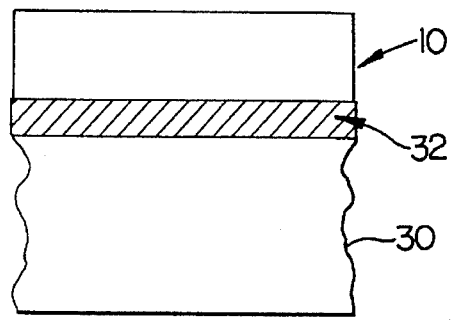
Figure 4C:
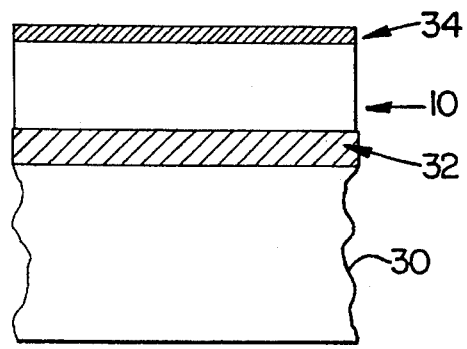
Figure 4D:
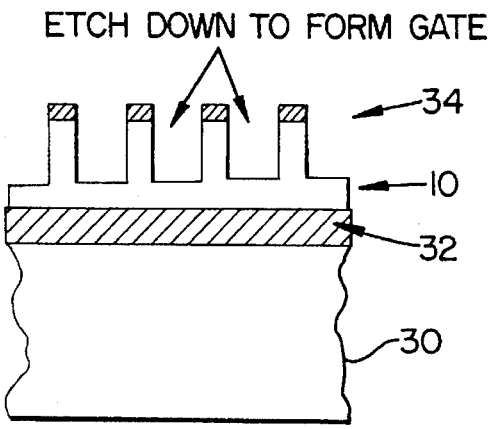
Figure 4E:
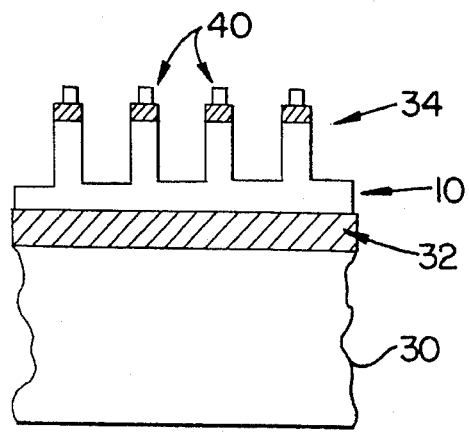
Figure 4F:
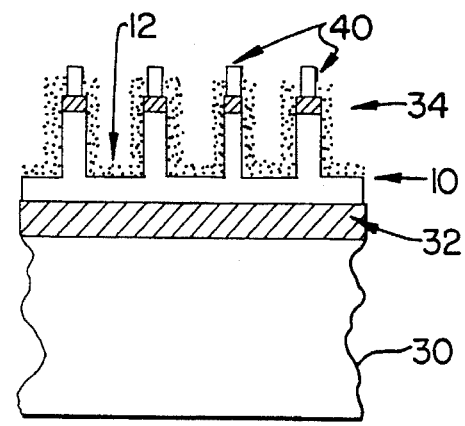
Figure 4G:
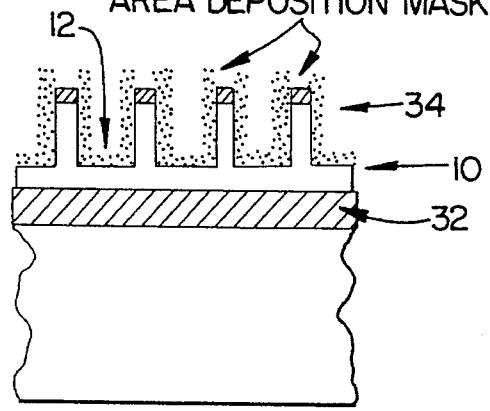
Figure 4H:
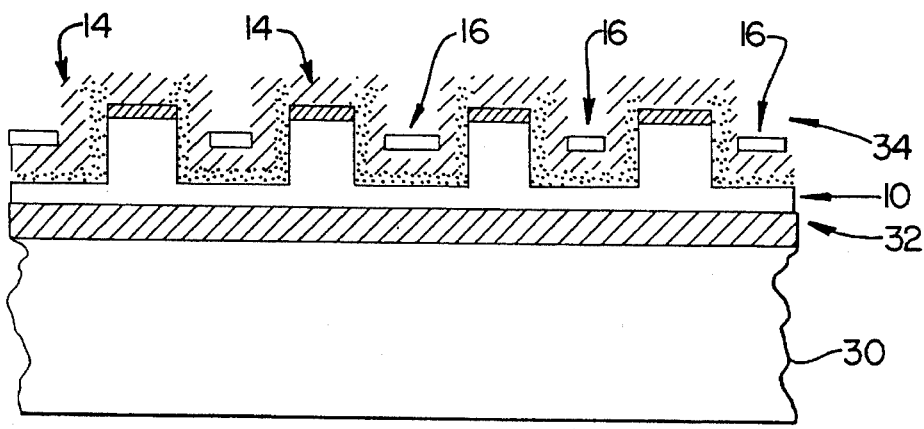
Figure 4I:
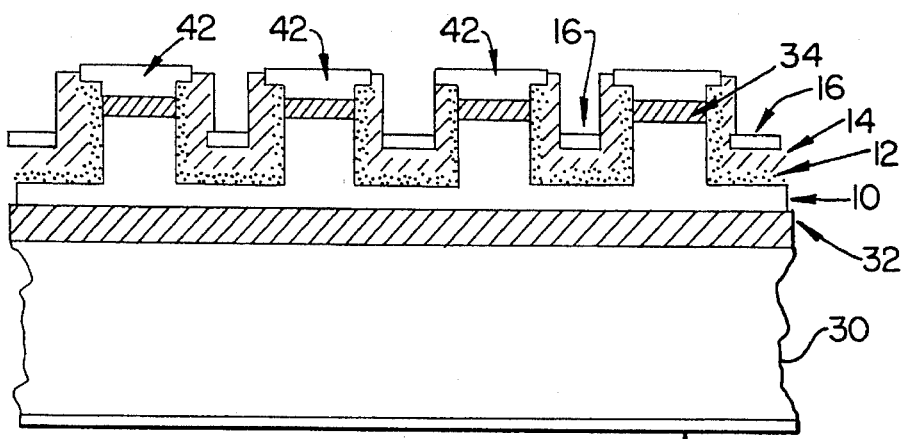
FIG. 4(i) shows a cross-sectional view of a vertical diamond field effect transistor incorporating a preferred embodiment of the junction of the present invention.

Next, referring to FIG. 3, a horizontal field effect transistor incorporating the MOiS junction of the present invention will be described in detail.

A first intrinsic diamond film 18 of a thickness in the range of about 1–30 um is deposited using a chemical vapor deposition (CVD) technique on a silicon substrate 20 to form an insulating substrate with the silicon substrate. A lightly doped boron-doped diamond film 10 is formed, using a CVD technique, on the first intrinsic diamond film 18. The thickness of this lightly boron-doped diamond film 10 will depend on the doping concentration; for example, for a doping concentration. $N_a=1\times10^{18}$ cm$^{-3}$, the thickness is 700A. A second intrinsic diamond film 12 is then selectively deposited, using a CVD technique, on an area (designated as the gate region) of the lightly boron-doped diamond film 10 between areas designated as source/drain regions. The thickness of this second intrinsic diamond film may be in the range of 100A to 50,000A and is preferably in the range of 200A to 2000A. An ion implantation method such as described in U.S. Pat. No. 5,254,862 entitled *Diamond Field-Effect Transistor With A Particular Boron Distribution Profile,* the disclosure of which is incorporated herein by reference in its entirety, is then used to form areas of high dopant concentration 24 in those areas of the lightly boron doped diamond film 10 designated as source and drain regions. One set of typical conditions for boron implantions is as follows:

Dose=5×10$^{16}$ cm$^{-3}$ Energy=60 KeV

Annealing is then preformed at a temperature of 1200° C. for 30 minutes in a vacuum and is followed by etching, as necessary, using $CrO_3H_2SO_4$, Aqua Regia, and a RCA set of solutions {$(NH_4)OH:H_2O_2:H_2O,HCl:H_2O_2:H_2O$}.

Metal contacts 26 are then deposited on these ion implanted areas to form source and drain ohmic contacts respectively. A film of almost any metal may be used; however, a suitably annealed Ti/Au contact can yield very low resistance contacts.

An alternative method to ion implantation for forming highly doped regions is to selectively deposit highly doped diamond films (concentration 10$^{20}$ cm$^{-3}$) on the regions designated as source and drain regions. Metal contacts are then deposited directly on these highly doped diamond films.

The entire device area is then coated, using a technique such as remote plasma assisted CVD such as disclosed in Fountain et al., *IGFET Fabrication of Homoepitaxial Diamond Using in Situ Boron and Lithium Doping,* presented at the Electrochemical Society meeting held in Washington, D.C., in May 1991, or sputtering, with a SiO$_2$ film 14 of a thickness in the range of about 300–1000A. This layer is then patterned and etched using a buffered solution of hydrofluoric acid to expose the source and drain contacts 26. A gold contact is then metallized on the silicon dioxide film 14 using standard lift-off process to form a gate contact 16.

Thus, the constructed FET is operated in depletion mode with negative bias on the drain contact and positive bias on the gate contact. Gate operation may also be in an accumulation mode (negative bias) since the SiO$_2$ film acts as a barrier to the transport of "holes."

Next, with reference to FIGS. 4(*a*) to 4(*i*), a vertical semiconducting diamond field effect transistor incorporating the MOiS junction of the present invention will be described.

A first heavily boron-doped diamond film 32 is deposited on silicon substrate 30 using a CVD technique. A first lightly doped diamond film 10 is then deposited using a CVD technique on the first heavily boron-doped diamond film 32. A second heavily boron doped diamond film 34 is then deposited using a CVD technique on the first lightly doped diamond film 10. Subsequently, part of the second heavily boron doped diamond film is etched away to reveal areas of the first lightly doped diamond film 10. A selective deposition mask 40 is then used to cover those areas of the second heavily boron doped diamond film 34 remaining after etching. Then a film of intrinsic diamond 12 is then deposited through the holes in the selective deposition mask 40 onto the exposed portion of the lightly doped diamond film 10. The selective deposition mask 40 is then removed and the entire device area is coated with a film silicon dioxide 14. This layer is then patterned and etched in a buffered solution of hydrofluoric acid to expose areas of the second heavily boron doped diamond film 34. Metal contacts are deposited on the silicon dioxide film 14 to form gate contacts 16 and on the surface of the substrate 20 opposite that surface upon which the first heavily boron doped diamond film 32 is deposited to form a drain contact 38.

It is to be noted that the MOiS junction of the present invention can also be used in U-V photodetectors, capacitors, and charge coupled devices.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alterations and modifications as fall within the true spirit and scope of the invention.

The foregoing is illustrative of the present invention and is not to be construed as limiting thereof. The invention is defined by the following claims, with equivalents of the claims to be included therein.

That which is claimed is:

1. An electronic device comprising:

a semiconducting diamond film;

a double layer structure on said semiconducting diamond film wherein said double layer structure consists of an intrinsic diamond film and a film of a carrier blocking material; and a contact on said double layer structure.

2. The electronic device according to claim 1, wherein said intrinsic diamond film is formed on said semiconducting diamond film and said film of a carrier blocking material is formed on said intrinsic diamond film.

3. The electronic device according to claim 1, wherein said carrier blocking material is silicon dioxide.

4. The electronic device according to claim 1, wherein said carrier blocking material is a material selected from the group consisting of aluminum oxide, cubic boron nitride, and aluminum nitride.

5. The electronic device according to claim 1, wherein said semiconducting diamond film is a boron-doped diamond film.

6. The electronic device according to claim 1, wherein said contact is made from a material selected from the group consisting of gold, aluminum, silver, nickel, palladium, platinum, tungsten, magnesium, titanium, chromium, and alloys therewith.

7. The electronic device according to claim 1, wherein said intrinsic diamond film and said film of a carrier blocking material have thicknesses in the range of 0.01 to 5 microns.

8. The electronic device according to claim 7, wherein said intrinsic diamond film and said film of a carrier blocking material preferably have thicknesses in the range of 0.1 to 0.5 microns.

9. A horizontal field effect transistor comprising:

a semiconducting diamond film;

a double layer structure on a first surface of said semiconducting diamond film wherein said double layer structure consists of an intrinsic diamond film and a film of a carrier blocking material;

a gate contact on said double layer structure; and source and drain contacts formed on said first surface of said semiconducting diamond film.

10. The horizontal field effect transistor according to claim 9, wherein said intrinsic diamond film is formed on said semiconducting diamond film and said film of a carrier blocking material is formed on said intrinsic diamond film.

11. The horizontal field effect transistor according to claim 9, further comprising a film of heavily doped diamond between said source contact and said semiconducting diamond film and between said drain contact and said semiconducting diamond film.

12. The horizontal field effect transistor according to claim 9, wherein the areas of the semiconducting diamond film upon which the source and drain contacts are formed are high in dopant concentration.

13. The horizontal field effect transistor according to claim 9, wherein said source and drain contacts are Ti/Au contacts.

14. The horizontal field effect transistor according to claim 9, wherein said carrier blocking material is silicon dioxide.

15. The horizontal field effect transistor according to claim 9, wherein said gate contact is a contact made from a material selected from the group consisting of gold, aluminum, silver, nickel, palladium, platinum, tungsten, magnesium, titanium, chromium, and alloys therewith.

16. The horizontal field effect transistor according to claim 9, wherein said semiconducting diamond film is a boron doped diamond film.

17. A vertical field effect transistor comprising:

a semiconducting diamond film;

a double layer structure on a surface of said semiconducting diamond film wherein said double layer structure consists of an intrinsic diamond film and film of a carrier blocking material;

a gate contact on said double layer structure;

a source contact formed on a surface of said semiconducting diamond film; and a drain contact formed on the surface of said semiconducting diamond film opposite the surface upon which said source contact is formed.

18. The vertical field effect transistor according to claim 17, wherein said intrinsic diamond film is formed on said semiconducting diamond film and said film of a carrier blocking material is formed on said intrinsic diamond film.

19. The vertical field effect transistor according to claim 17, further comprising films of heavily doped diamond film formed between said source and drain contacts and said semiconducting diamond film.

20. The vertical field effect transistor according to claim 17, wherein said source and said drain contact are Ti/Au contacts.

21. The vertical field effect transistor according to claim 17, wherein said carrier blocking material is silicon dioxide.

22. The vertical field effect transistor according to claim 17, wherein said semiconducting diamond film is a boron doped diamond film.

23. The vertical field effect transistor according to claim 17, wherein said contact is made from a material selected from the group consisting of gold, aluminum, silver, nickel, palladium, platinum, tungsten, magnesium, titanium, chromium, and alloys therewith.

* * * * *